(12) United States Patent
Takao et al.

(10) Patent No.: US 9,719,770 B2
(45) Date of Patent: Aug. 1, 2017

(54) TOUCHSCREEN SENSOR

(71) Applicant: NITTO DENKO CORPORATION, Ibaraki-shi, Osaka (JP)

(72) Inventors: Hiroyuki Takao, Ibaraki (JP); Toru Umemoto, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 66 days.

(21) Appl. No.: 14/508,366

(22) Filed: Oct. 7, 2014

(65) Prior Publication Data

US 2015/0022222 A1 Jan. 22, 2015

Related U.S. Application Data

(63) Continuation of application No. PCT/JP2014/060368, filed on Apr. 10, 2014.

(30) Foreign Application Priority Data

May 27, 2013 (JP) ................................. 2013-111286

(51) Int. Cl.
*G06F 3/041* (2006.01)
*G06F 3/044* (2006.01)
(Continued)

(52) U.S. Cl.
CPC ........... *G01B 7/14* (2013.01); *G01R 27/2605* (2013.01); *G06F 3/041* (2013.01); *G06F 3/044* (2013.01); *G01B 2210/58* (2013.01)

(58) Field of Classification Search
None
See application file for complete search history.

(56) References Cited

U.S. PATENT DOCUMENTS 9,207,482 B2 * 12/2015 Nashiki .................. G06F 3/044
2005/0083307 A1 * 4/2005 Aufderheide .......... G06F 3/044
345/173
(Continued)

FOREIGN PATENT DOCUMENTS

CN 202351830 U 7/2012
CN 102652340 A 8/2012
(Continued)

OTHER PUBLICATIONS

Approval Decision Letter from the Intellectual Property Office dated Nov. 27, 2015, issued in counterpart Taiwanese Application No. 103118310, with English translation. (5 pages).
(Continued)

*Primary Examiner* — Antonio Xavier
(74) *Attorney, Agent, or Firm* — Westerman, Hattori, Daniels & Adrian, LLP

(57) ABSTRACT

A touchscreen sensor includes a transparent base material, a first transparent electrode pattern, a first index-matching layer and a first adhesive layer disposed in this order at one side of the transparent base material, and a second transparent electrode pattern, a second index-matching layer and a second adhesive layer disposed in this order at another side of the transparent base material. The first index-matching layer has a refractive index greater than a refractive index of the first adhesive layer. The second index-matching layer has a refractive index greater than a refractive index of the second adhesive layer. Each of the first index-matching layer and the second index-matching layer has a thickness of 85 nm to 120 nm.

6 Claims, 1 Drawing Sheet

(51) Int. Cl.
*G01B 7/14* (2006.01)
*G01R 27/26* (2006.01)

(56) References Cited

U.S. PATENT DOCUMENTS

| | | | | |
|---|---|---|---|---|
| 2008/0138589 | A1* | 6/2008 | Wakabayashi | G06F 3/044 428/195.1 |
| 2008/0152879 | A1* | 6/2008 | Nashiki | C23C 14/08 428/212 |
| 2010/0225612 | A1* | 9/2010 | Ishizaki | G02F 1/13338 345/174 |
| 2011/0147340 | A1* | 6/2011 | Nashiki | G06F 3/044 216/13 |
| 2012/0114919 | A1 | 5/2012 | Nakajima et al. | |
| 2012/0241199 | A1 | 9/2012 | Kobayashi et al. | |
| 2013/0048214 | A1 | 2/2013 | Kalkowski et al. | |
| 2013/0113757 | A1 | 5/2013 | Tanaka et al. | |
| 2013/0194220 | A1* | 8/2013 | Lee | G06F 3/041 345/173 |
| 2013/0258570 | A1 | 10/2013 | Nashiki et al. | |
| 2014/0028570 | A1* | 1/2014 | Guard | G06F 3/044 345/173 |
| 2014/0049827 | A1* | 2/2014 | Fujii | G02B 1/11 359/586 |
| 2014/0050905 | A1* | 2/2014 | Hao | H01B 5/14 428/212 |

FOREIGN PATENT DOCUMENTS

| | | |
|---|---|---|
| JP | 2009-73090 A | 4/2009 |
| JP | 2011-194679 A | 10/2011 |
| JP | 2011-253546 A | 12/2011 |
| JP | 2012-66477 A | 4/2012 |
| JP | 2012-203701 A | 10/2012 |
| JP | 2013-8099 A | 1/2013 |
| KR | 10-2011-0061685 A | 6/2011 |
| KR | 10-2012-0012329 A | 2/2012 |
| KR | 10-2012-0047828 A1 | 5/2012 |
| KR | 10-2012-0109267 A1 | 10/2012 |
| TW | 200741753 A | 11/2007 |
| TW | 201220327 A1 | 5/2012 |
| TW | 201238763 A1 | 10/2012 |
| TW | 201314246 A1 | 4/2013 |
| WO | 2012/073990 A1 | 6/2012 |

OTHER PUBLICATIONS

International Preliminary Report on Patentability (Form PCT/IB/373) issued in counterpart International Application No. PCT/JP2014/060368 dated Apr. 10, 2014, with Form PCT/ISA/237. (4 pages).
Written Opinion dated Oct. 6, 2014, issued in counterpart International Application No. PCT/JP2014/060368, with English translation. (4 pages).
Korean Office Action dated Nov. 26, 2015 issued in counterpart Korean Patent Application No. 10-2014-7022547, with English translation. (7 pages).
International Search Report dated Jun. 10, 2014, issued in corresponding application No. PCT/JP2014/060368.
Written Opinion of the International Searching Authority dated Jun. 10, 2014, issued in corresponding application No. PCT/JP2014/060368.
Office Action dated Jul. 14, 2015 issued in counterpart Taiwanese Application No. 103118310, with English translation (13 pages).
Office Action dated Jun. 3, 2016, issued in counterpart Chinese Patent Application No. 201480001155.5, with English translation. (14 pages).
Decision for Grant of Patent dated Sep. 21, 2016, issued in counterpart Korean Patent Application No. 10-2014-7022547, with English translation. (3 pages).
Decision to Grant a Patent dated Aug. 29, 2016, issued in counterpart Japanese Patent Application No. 2013-111286, with English translation. (6 pages).
Office Action dated Apr. 13, 2016, issued in counterpart Korean Patent Application No. 10-2014-7022547, with English translation. (8 pages).
Office Action dated Mar. 2, 2017, issued in counterpart Korean Application No. 10-2016-7035516, with English translation. (5 pages).
Request for Consultation dated Mar. 2, 2017, issued in counterpart Korean Application No. 10-2016-7035516, with English translation. (3 pages).
Office Action dated Mar. 21, 2017, issued in counterpart Chinese Application No. 201480001155.5, with English translation. (13 pages).

* cited by examiner

TOUCHSCREEN SENSOR

CROSS REFERENCE TO RELATED APPLICATIONS

This is a continuation application of International Patent Application No. PCT/JP2014/060368 filed Apr. 10, 2014, which claims the benefit of Japanese Patent Application No. 2013-111286, filed May 27, 2013, the full contents of all of which are hereby incorporated by reference in their entirety.

BACKGROUND

Technical Field

The present disclosure relates to a touchscreen sensor applicable to an input display device that is capable of inputting information by a touch with a finger, a stylus pen and the like.

Background Art

In the related art, laminated film having a transparent conductor layer at both sides of a transparent base material is known (Japanese Laid-Open Patent Publication No. 2012-066477). Such a laminated film enables accurate patterning of each of the transparent conductor layers and thus has a high relative positional accuracy of transparent electrode patterns.

However, with a configuration as described above in which transparent electrode patterns are formed at both sides of the transparent base material, when a touchscreen sensor is fabricated by directly laminating an adhesive layer on each of the transparent electrode patterns, there is a problem that interference fringes may be produced when light from outside is incident thereon.

The present disclosure is directed to providing a touchscreen sensor that can suppress occurrence of the interference fringes.

SUMMARY

According to an aspect of the present disclosure, a touchscreen sensor includes a transparent base material, a first transparent electrode pattern, a first index-matching layer and a first adhesive layer disposed in this order at one side of the transparent base material, and a second transparent electrode pattern, a second index-matching layer and a second adhesive layer disposed in this order at another side of the transparent base material, the first index-matching layer having a refractive index greater than a refractive index of the first adhesive layer, the second index-matching layer having a refractive index greater than a refractive index of the second adhesive layer, each of the first index-matching layer and the second index-matching layer having a thickness of 85 nm to 120 nm.

Preferably, a difference between the refractive index of the first index-matching layer and the refractive index of the first adhesive layer is 0.1 to 0.4, and a difference between the refractive index of the second index-matching layer and the refractive index of the second adhesive layer is 0.1 to 0.4.

Preferably, the refractive index of the first index-matching layer and the refractive index of the second index-matching layer are each 1.5 to 1.8.

Preferably, the thickness of the first index-matching layer and the thickness of the second index-matching layer are each 90 nm to 110 nm.

Preferably, the refractive index of the first index-matching layer is greater than the refractive index of the first adhesive layer and smaller than the refractive index of the first transparent electrode pattern, and the refractive index of the second index-matching layer is greater than the refractive index of the second adhesive layer and smaller than the refractive index of the second transparent electrode pattern.

According to the present disclosure, the first index-matching layer has a refractive index greater than a refractive index of the first adhesive layer, the second index-matching layer has a refractive index greater than a refractive index of the second adhesive layer, and each of the first index-matching layer and the second index-matching layer has a thickness of 85 nm to 120 nm. Accordingly, a touchscreen sensor that can suppress occurrence of interference fringes can be provided.

DETAILED DESCRIPTION

Further features of the present disclosure will become apparent from the following detailed description of exemplary embodiments with reference to the accompanying drawings.

Figure 1A:
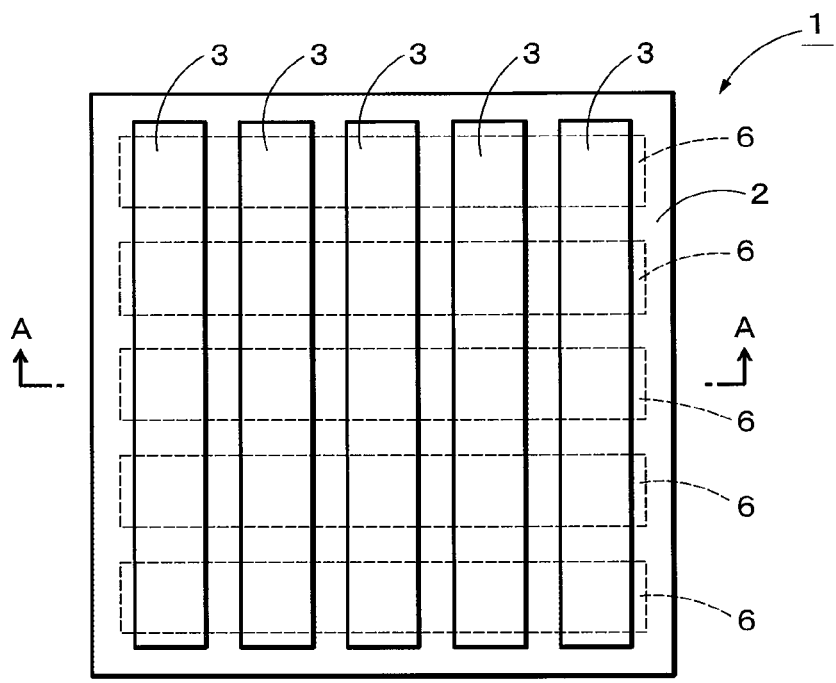
FIG. 1A is a plan view schematically showing a configuration of a touchscreen sensor according to an embodiment of the present disclosure, and, FIG. 1B is a cross sectional view taken along line A-A in FIG. 1A.
Figure 1B:
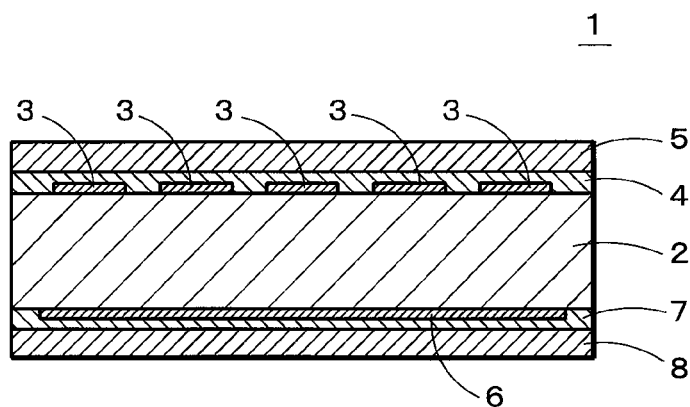

FIG. 1A is a plan view schematically showing a configuration of a touchscreen sensor according to an embodiment of the present disclosure, and, FIG. 1B is a cross sectional view taken along line A-A in FIG. 1A. Note that a length, a width or a thickness of each element in FIGS. 1A and 1B are shown by way of example, and a length, a width or a thickness of each element of the touchscreen sensor of the present disclosure are not limited to those shown in FIGS. 1A and 1B.

As shown in FIGS. 1A and 1B, a touchscreen sensor 1 of the present disclosure has a transparent base material 2, and a transparent electrode pattern 3 (first transparent electrode pattern), an index-matching layer 4 (first index-matching layer) and an adhesive layer 5 (first adhesive layer) disposed in this order on one side of the transparent base material. Further, the touchscreen sensor 1 has a transparent electrode pattern 6 (second transparent electrode pattern), an index-matching layer 7 (second index-matching layer) and an adhesive layer 8 (second adhesive layer) disposed in this order on another side of the transparent base material 2.

The index-matching layer 4 has a refractive index (relative refractive index) greater than a refractive index of the adhesive layer 5, and the index-matching layer 7 has a refractive index greater than a refractive index of the adhesive layer 8. Further, each of the index-matching layer 7 and the index-matching layer 8 has a thickness of 85 nm to 120 nm.

In the touchscreen sensor 1 configured as described above, the index-matching layer 4 having a specific property is disposed between the transparent electrode pattern 3 and the adhesive layer 5, and the index-matching layer 7 having a specific property is disposed between transparent electrode pattern 6 and the adhesive layer 8. By disposing in such a manner, a refractive index difference at an interface of laminated layers can be decreased. Thus, reflection of light from outside is weakened, and occurrence of interference fringes can be suppressed effectively.

A touchscreen sensor of the related art is fabricated by directly laminating an adhesive layer on each transparent electrode pattern. In such a touchscreen sensor, interference fringes occur due an interference phenomenon between reflected light that is reflected on a top surface of the transparent electrode pattern laminated at a front side (viewing side) of the transparent base material (an interface between the adhesive layer and the transparent electrode pattern) and reflected light that is reflected on a top surface of the transparent electrode pattern laminated at a reverse side (a side opposite to the viewing side) of the transparent base material (an interface between the transparent base material and the transparent electrode pattern). Accordingly, in the present disclosure, reflected light produced on the front side of the transparent base material is particularly taken into account, and the index-matching layer 4 is disposed between the transparent electrode pattern 3 and the adhesive layer 5. Thereby, the reflected light reflecting on the top surface of the transparent electrode pattern 3 can be weakened. Further, it is preferable to fabricate the touchscreen sensor in such a manner that a cross sectional structure thereof is front-and-back symmetrical, since there may be a case where the touchscreen sensor is arranged with front and back being reversed in the manufacturing process of a touch screen. Accordingly, the index-matching layer 7 is disposed between the transparent electrode pattern 6 and the adhesive layer 8. With this configuration, interference between the reflected light that is reflected on the top surface of the transparent electrode pattern 3 and the reflected light that is reflected on the top surface of the transparent electrode pattern 6 can be suppressed by weakening the reflected light reflecting on the top surface of the transparent electrode pattern 3.

Note that, unless otherwise specified, refractive indices in the present disclosure are values with respect to air measured at 25° C. using sodium D lines (wavelength 589.3 nm).

The touchscreen sensor 1 of the present disclosure includes the transparent electrode pattern 3 formed on the transparent base material 2, but it is not limited thereto. An easy adhesive layer (anchor coat layer) for increasing an adhesive strength, another index-matching layer, or a hard coat layer for increasing a surface hardness of the transparent base material may be provided between the transparent base material and the transparent electrode pattern.

Details of each component of the touchscreen sensor 1 will now be described below.

(1) Transparent Base Material

The transparent base material in the present disclosure supports each of the first and second transparent electrode patterns. The transparent base material has a thickness of, for example, 20 μm to 200 μm.

The transparent base material is preferably a polyethylene terephthalate film, a polycarbonate film or a polycycloolefin film, but it is not particularly limited thereto. Particularly, a polycycloolefin film is preferable from a point of view of improving sensitivity of the touchscreen sensor. Since a polycycloolefin film has permittivity lower than those of other materials, electrostatic capacity between the first transparent electrode pattern and the second transparent electrode pattern can be decreased. In a case where the touchscreen sensor of the present disclosure is used in a capacitive sensing type touchscreen, a change in electrostatic capacity that is produced as a finger comes close to the transparent electrode pattern becomes relatively large when an electrostatic capacity between the transparent electrode patterns is reduced, and thus touch sensitivity improves.

(2) Transparent Electrode Pattern

The first and second transparent electrode patterns in the present disclosure serve as a sensor for detecting a touch position. In general, the first and second transparent electrode patterns are electrically connected to a wiring (not shown) formed at an end portion of the transparent member, and the wiring is connected to a controller IC (not shown).

The first and second transparent electrode patterns are formed in a lattice form in a plan view with one of them being an electrode for X-coordinates and the other being an electrode for Y-coordinates (FIG. 1A). Each transparent electrode pattern is, for example, stripe shaped or diamond shaped, but not particularly limited thereto.

The first and second transparent electrode patterns are typically made of a transparent conductor. The transparent conductor is a material that has a high transmittance in a visible light range (preferably greater than or equal to 80%), and a surface resistance value per unit area ($\Omega/\square$: ohms per square) of less than or equal to 500 $\Omega/\square$.

Normally, each of the first and second transparent electrode patterns has a refractive index of 1.9 to 2.5, which is the highest among refractive indices of members constituting the touchscreen sensor. A material forming the transparent conductor is, for example, an indium tin oxide (refractive index 2.0) or an indium zinc oxide (refractive index 2.3).

Each of the first and the second transparent electrode patterns has a height of preferably 10 nm to 100 nm, a width of preferably 0.1 mm to 5 mm, and a pitch of preferably 0.5 mm to 10 mm.

A method of forming the first and second transparent electrode patterns may be a method including forming a transparent conductor layer over an entire surface of the transparent base material by sputtering or vacuum evaporation, and thereafter patterning the transparent conductor layer by an etching treatment.

(3) Index-Matching Layer

The index-matching layers in the present disclosure are transparent layers each having a refractive index that is adjusted to a particular value to suppress reflection on the transparent electrode patterns. The first index-matching layer is formed on one side of the transparent base material to cover the first transparent electrode pattern, and the second index-matching layer is formed on another side of the transparent base material to cover the second transparent electrode pattern.

The first and second index-matching layers are each formed of a material which is preferably a light cured inorganic-organic composite material composed of an organic component, which may be a photosensitive resin or a photosensitive monomer, scattered with inorganic particles, but it is not particularly limited thereto. The inorganic particles may be, for example, silica, alumina, zirconia, and titanium oxide. The inorganic-organic composite material can be used in wet coating, and, as compared to dry coating such as sputtering, the wet coating does not require considerable equipment investment such as vacuum devices and suitable for a larger area, and thus has an improved productivity. The inorganic-organic composite material may be a material of, for example, an OPSTAR Z series (manufactured by JSR Corporation).

The first index-matching layer has a refractive index greater than the refractive index of the first adhesive layer and preferably smaller than the refractive index of the first transparent electrode pattern. The second index-matching layer has a refractive index greater than the refractive index of the second adhesive layer, and preferably smaller than the refractive index of the second transparent electrode pattern.

A difference in refractive index $\Delta n1$ (relative difference in refractive index) between the first index-matching layer and the first adhesive layer is preferably 0.1 to 0.4, and a difference in refractive index Δn2 between the second index-matching layer and the second adhesive layer is preferably 0.1 to 0.4. In a case where the difference in refractive index Δn1 and the difference in refractive index Δn2 are smaller than 0.1, an effect of suppressing the occurrence of the interference fringes is small. In a case where the difference in refractive index Δn1 and the difference in refractive index Δn2 are greater than 0.4, new reflection is produced at an interface between the index-matching layer and the adhesive layer, and interference fringes due to this could occur.

From the view point of further suppressing occurrence of the interference fringes, the refractive index of each of the first and second index-matching layers is preferably 1.5 to 1.8, and more preferably, 1.5 to 1.7. When using an inorganic-organic composite material as the index-matching layer, the refractive index of the index-matching layer can be increased or decreased as appropriate by changing the type and the content of the inorganic particles.

Each of the first and second index-matching layers has a thickness of 85 nm to 120 nm, and preferably 90 nm to 110 nm from the view point of further suppressing occurrence of the interference fringes. Note that the material, the refractive index and the thickness of the first and second index-matching layers may be the same or may be different from each other.

(4) Adhesive Layer

The first and second adhesive layers in the present disclosure are laminated on the surfaces of the first and second index-matching layers, respectively. Each of the first and the second adhesive layers has a thickness of preferably 10 μm to 100 μm. From the viewpoint of uniformity and transparency, the material forming the first and second adhesive layers is preferably an acrylic adhesive. Each of the first and second adhesive layers has a refractive index of preferably 1.4 to 1.6.

As mentioned above, according to the present embodiment, since the refractive index of the first index-matching layer is greater than the refractive index of the first adhesive layer, and the refractive index of the second index-matching layer is greater than the refractive index of the second adhesive layer, and further, since each of the first index-matching layer and the second index-matching layer has a thickness of 85 nm to 120 nm, reflection of light from outside becomes weaker, and occurrence of the interference fringes can be suppressed.

In the above description, a touchscreen sensor of the present embodiment has been described, but the present disclosure is not limited to the embodiment described above, and various alterations and modifications can be made based on a technical concept of the present disclosure.

Examples of the present disclosure will be described below.

EXAMPLES

Example 1

A hardcoat layer containing spherical particles of 3 μm in diameter and an index-matching layer having a refractive index of 1.65 and a thickness of 100 nm were formed sequentially on both sides of a transparent base material made of a polycycloolefin film (manufactured by Nippon Zeon Corporation, product name ZEONOR) having a thickness of 100 μm.

Then, the transparent base material was placed in a sputtering device in which a sintered target containing indium oxide of 97% by weight and tin oxide of 3% by weight was installed, and an indium tin oxide layer having a thickness of 27 nm was formed at one side of the transparent base material by sputtering. Thereafter, a process similar to the above was performed at the other side of the transparent base material, and an indium tin oxide layer having a thickness of 27 nm was formed. Then, the transparent base material provided with the indium tin oxide layer at both sides was heat-treated at 150° C. for 90 minutes, and each of the indium tin oxide layer was converted from amorphous to crystalline.

Thereafter, the indium tin oxide layer formed at one side of the transparent base material was protected by laminating a protective layer of a polyester film (manufactured by Sun A. Kaken Co., Ltd.) thereon. On the indium tin oxide layer formed at the other side, a photoresist was applied in a striped shape and thereafter immersed in hydrochloric acid to form a transparent electrode pattern. Subsequently, a similar process was performed on the indium tin oxide layer formed at the other side of the transparent base material, and the transparent electrode patterns were formed at both sides of the transparent base material.

Then, at one side of the transparent base material, an inorganic-organic composite material (manufactured by JSR Corporation, product name OPSTAR KZ6661) in which inorganic particles are scattered in an organic component of a photosensitive monomer was applied so as to cover the transparent electrode pattern and light cured to form the first index-matching layer having a refractive index of 1.65 and a thickness of 100 nm. A similar process was performed on the other side of the transparent base material to form the second index-matching layer.

Then, on a surface of each of the first and second index-matching layers, an acrylic adhesive layer (manufactured by Nitto Denko Corporation, product name LUCI-ACS) having a refractive index of 1.5 was laminated to fabricate a touchscreen sensor.

Example 2

A touchscreen sensor was fabricated with a method similar to the method of Example 1, except that a thickness of each of the first and second index-matching layers was 85 nm.

Example 3

A touchscreen sensor was fabricated with a method similar to the method of Example 1, except that a thickness of each of the first and second index-matching layers was 120 nm.

Comparative Example 1

A touchscreen sensor was fabricated with a method similar to the method of Example 1, except that a thickness of each of the first and second index-matching layers was 60 nm.

Comparative Example 2

A touchscreen sensor was fabricated with a method similar to the method of Example 1, except that a thickness of each of the first and second index-matching layers was 140 nm.

Then, each of the touchscreen sensors of Examples 1 to 3 and Comparative Examples 1 and 2 fabricated as described above was placed on a smooth evaluation table and a glass plate (manufactured by Corning Incorporated, product name GORILLA) was disposed at a viewing side and a black tape for antireflection was attached at the back side to provide a mock touchscreen. The touch screen was illuminated with a three-wavelength fluorescent lamp from the viewing side and a degree of occurrence of the interference fringes was evaluated by visual observation. The results are shown in Table 1. In Table 1, "○" denotes a case in which almost no interference fringes were viewed and "X" denotes a case in which interference fringes were viewed clearly.

TABLE 1

| | THICKNESS OF EACH OF FIRST AND SECOND INDEX-MATCHING LAYERS (nm) | EVALUATION OF INTERFERENCE FRINGES (VISUAL INSPECTION) |
|---|---|---|
| COMPARATIVE EXAMPLE 1 | 60 | x |
| EXAMPLE 2 | 85 | ○ |
| EXAMPLE 1 | 100 | ○ |
| EXAMPLE 3 | 120 | ○ |
| COMPARATIVE EXAMPLE 2 | 140 | x |

As shown in Example 1 of Table 1, when the refractive index of the first and second index-matching layers is 1.65, the refractive index of the first and second adhesive layers is 1.5, and the thickness of each of the first and second index-matching layers is 100 nm, almost no interference fringes were viewed in a touch screen. Also, in Example 2, when the refractive index of the first and second index-matching layers is 1.65, the refractive index of the first and second adhesive layers is 1.5, and the thickness of each of the first and second index-matching layers is 85 nm, almost no interference fringes were viewed in a touch screen. In Example 3, when the refractive index of the first and second index-matching layers is 1.65, the refractive index of the first and second adhesive layers is 1.5, and the thickness of each of the first and second index-matching layers is 120 nm, almost no interference fringes were viewed in a touch screen.

On the other hand, as shown in Comparative Example 1, when the refractive index of the first and second index-matching layers is 1.65, the refractive index of the first and second adhesive layers is 1.5, and the thickness of each of the first and second index-matching layers is 60 nm, interference fringes were clearly viewed in a touch screen. Also, as shown in Comparative Example 2, when the refractive index of the first and second index-matching layers is 1.65, the refractive index of the first and second adhesive layers is 1.5, and the thickness of each of the first and second index-matching layers is 140 nm, interference fringes were clearly viewed in a touch screen.

Therefore, it was found that occurrence of interference fringes can be sufficiently suppressed when the refractive index of the index-matching layer is higher than the refractive index of the adhesive layer and the thickness of the index-matching layer is 85 nm to 120 nm.

INDUSTRIAL APPLICABILITY

The use of the touchscreen sensor of the present disclosure is not particularly limited, and it is preferably a capacitive sensing touch screen that is used in portable terminals such as smartphones or tablet terminals (Slate PCs).

What is claimed is:

1. A touchscreen sensor comprising:
   a transparent base material;
   a first transparent electrode pattern, a first index-matching layer and a first adhesive layer disposed in this order at one side of the transparent base material, the first index-matching layer being provided on the first transparent electrode pattern, the first adhesive layer being provided on the first index-matching layer; and
   a second transparent electrode pattern, a second index-matching layer and a second adhesive layer disposed in this order at another side of the transparent base material, the second index-matching layer being provided on the second transparent electrode pattern, the second adhesive layer being provided on the second index-matching layer,
   the first index-matching layer having a refractive index greater than a refractive index of the first adhesive layer,
   the second index-matching layer having a refractive index greater than a refractive index of the second adhesive layer,
   each of the first index-matching layer and the second index-matching layer having a thickness of 85 nm to 120 nm.

2. The touchscreen sensor according to claim 1, wherein a difference between the refractive index of the first index-matching layer and the refractive index of the first adhesive layer is 0.1 to 0.4, and a difference between the refractive index of the second index-matching layer and the refractive index of the second adhesive layer is 0.1 to 0.4.

3. The touchscreen sensor according to claim 1, wherein the refractive index of the first index-matching layer and the refractive index of the second index-matching layer are each 1.5 to 1.8.

4. The touchscreen sensor according to claim 1, wherein the thickness of the first index-matching layer and the thickness of the second index-matching layer are each 90 nm to 110 nm.

5. The touchscreen sensor according to claim 1, wherein the refractive index of the first index-matching layer is greater than the refractive index of the first adhesive layer and smaller than a refractive index of the first transparent electrode pattern, and
   the refractive index of the second index-matching layer is greater than the refractive index of the second adhesive layer and smaller than a the refractive index of the second transparent electrode pattern.

6. The touchscreen sensor according to claim 1, wherein the thickness of the first index-matching layer and the thickness of the second index-matching layer are each 100 nm to 120 nm.

* * * * *